United States Patent [19]

Huber

[11] 4,323,947
[45] Apr. 6, 1982

[54] ELECTROSTATIC GUN WITH IMPROVED DIODE-CAPACITOR MULTIPLIER

[75] Inventor: Willi Huber, Altstätten, Switzerland

[73] Assignee: J. Wagner AG., Altstätten, Switzerland

[21] Appl. No.: 66,247

[22] Filed: Aug. 13, 1979

[51] Int. Cl.³ .............................................. B05B 5/02
[52] U.S. Cl. ...................................... 361/228; 363/61
[58] Field of Search ................. 361/227, 228; 363/59, 363/60, 61

[56] References Cited

U.S. PATENT DOCUMENTS

| | | | |
|---|---|---|---|
| 3,593,107 | 7/1971 | Chilton et al. | 363/61 |
| 3,599,038 | 8/1971 | Skidmore | 361/228 |
| 3,608,823 | 9/1971 | Buschor | 361/228 |
| 3,731,145 | 5/1973 | Senay | 361/228 |
| 3,902,108 | 8/1975 | Sion | 363/61 |
| 3,911,292 | 10/1975 | Petrick et al. | 363/61 |
| 4,033,506 | 7/1977 | Braun | 363/59 |
| 4,196,465 | 4/1980 | Buschor | 361/228 |

FOREIGN PATENT DOCUMENTS

| | | |
|---|---|---|
| 1123762 | 2/1962 | Fed. Rep. of Germany ........ 363/61 |
| 887659 | 1/1962 | United Kingdom . |
| 1190642 | 5/1970 | United Kingdom . |
| 1388112 | 3/1975 | United Kingdom . |

*Primary Examiner*—J. D. Miller
*Assistant Examiner*—L. C. Schroeder
*Attorney, Agent, or Firm*—Hill, Van Santen, Steadman, Chiara & Simpson

[57] ABSTRACT

A diode-capacitor multiplier circuit usable with an electro-static spray gun has two different values of capacitors. By changing the ratio of the number of larger size capacitors to the number of smaller size capacitors, the amount of energy stored in the multiplier circuit may be increased or decreased changing the probability of ignition, and also the quality of the coating received by the subject article.

3 Claims, 5 Drawing Figures

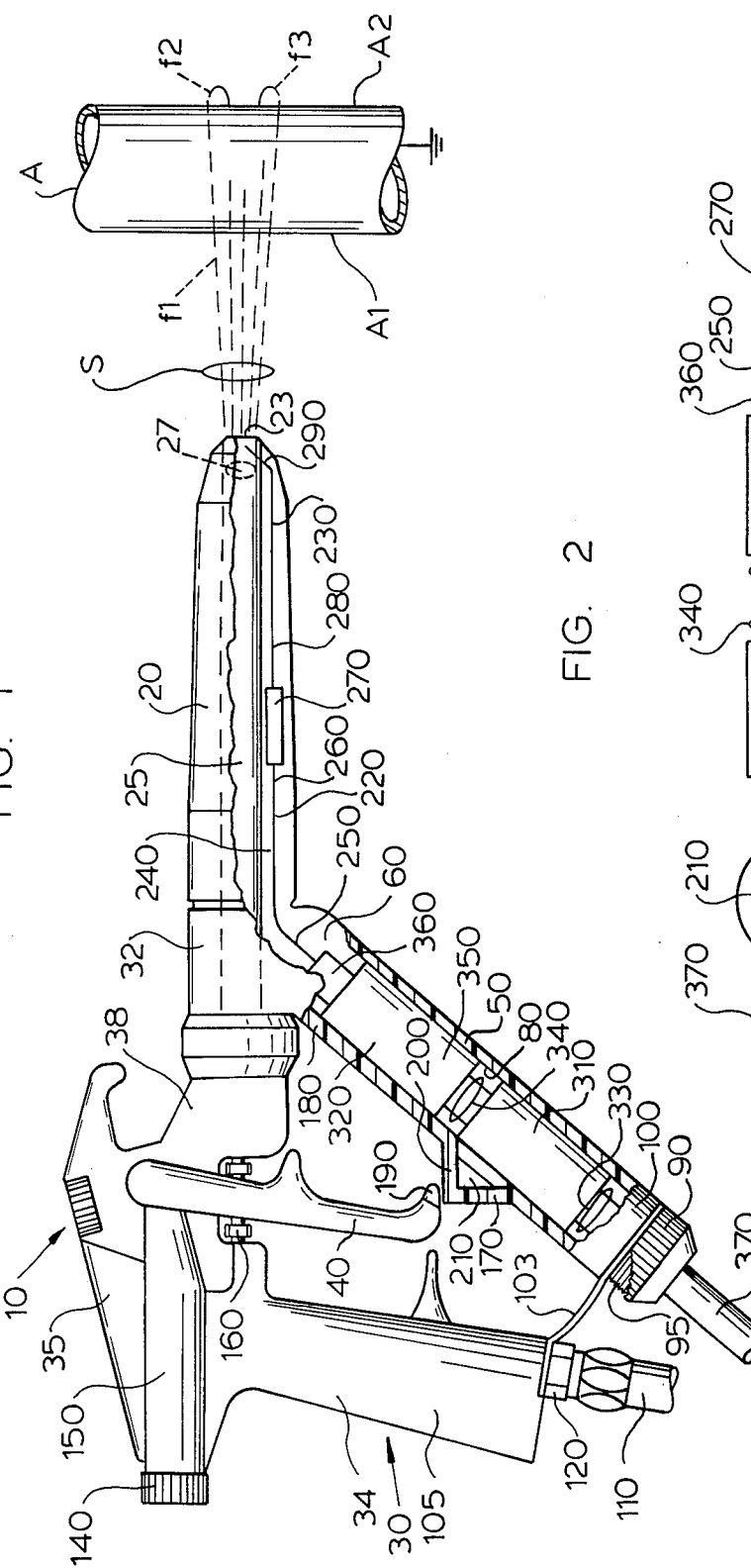
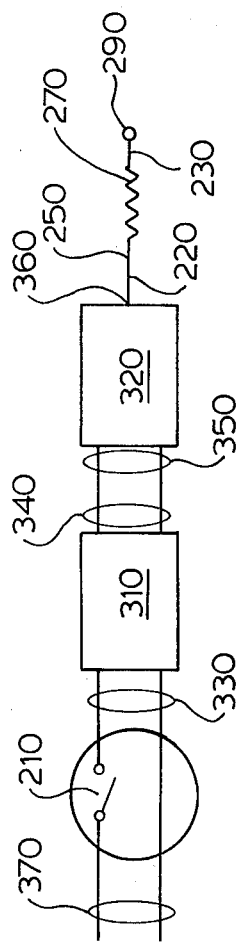

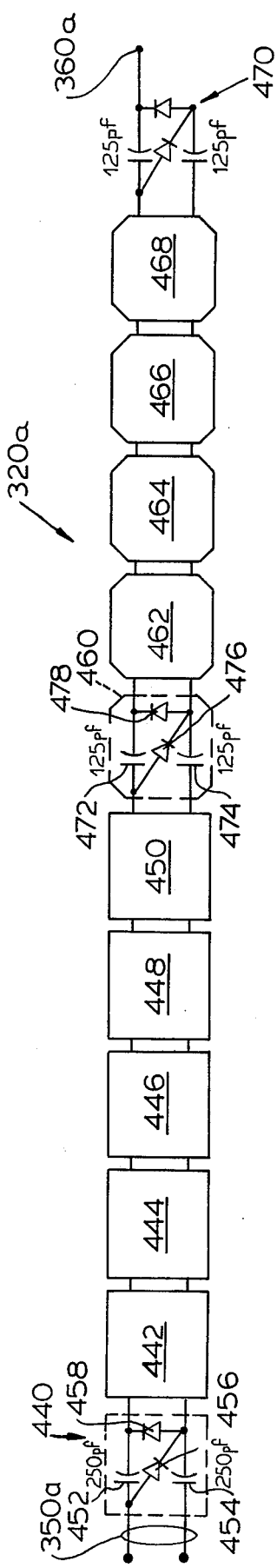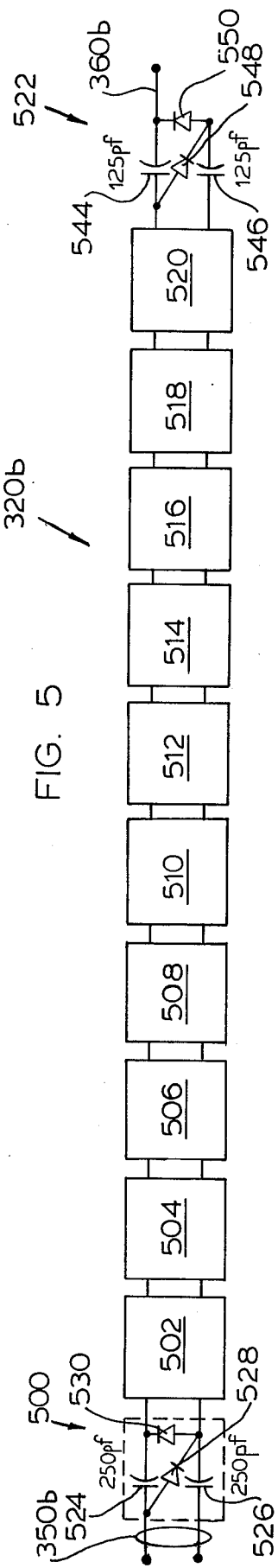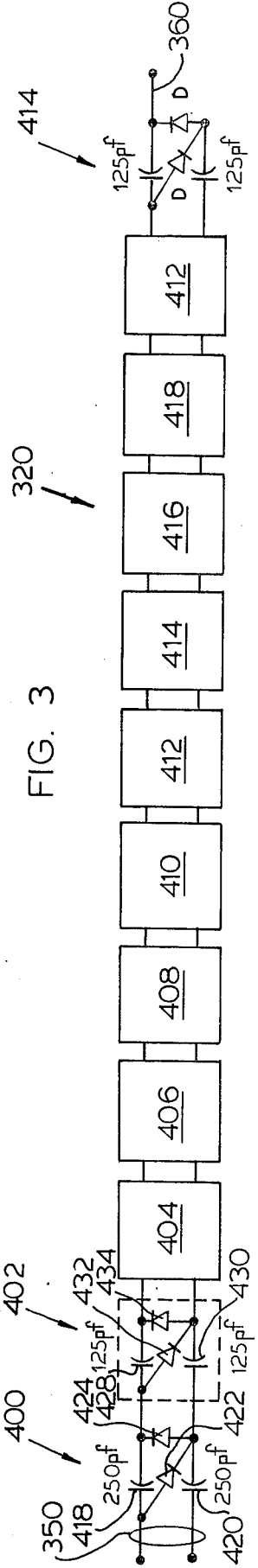
FIG. 4
FIG. 5
FIG. 3

ELECTROSTATIC GUN WITH IMPROVED DIODE-CAPACITOR MULTIPLIER

BACKGROUND OF THE INVENTION

1. Field of the Invention

The invention pertains to high voltage generator circuitry for use with electrostatic spray apparatus.

2. The Prior Art

It has been known that operating advantages might be attained through the use of electrostatic spray pistols wherein the high voltage generation circuitry, typically a 10-12 stage diode-capacitor voltage multiplier circuit, is located within the body of the hand-held unit.

U.S. Pat. No. 3,599,038 to Skidmore shows a hand-held piston with a low frequency diode-capacitor voltage multiplier circuit mounted within the pistol.

U.S. Pat. No. 3,731,145 to Senay and U.S. Pat. No. 3,608,823 to Buschor teach the use of a high frequency pulsating source to drive the gun-mounted diode-capacitor multiplier circuitry. Buschor and Senay allege that, at high frequencies, substantial reductions may be made in the capacitance value, hence physical size and weight, of each capacitor in the diode-capacitor multiplier circuit.

Another advantage to high frequency operation is that the amount of energy stored in the capacitors of the diode-capacitor multiplier circuit can be substantially reduced. Senay in particular teaches the importance of storing minimal amounts of energy in the capacitors of the diode-capacitor multiplier circuit so as to minimize sparking and ignition of flammable paint solvents.

Experience has indicated, however, that the minimal energy storage configuration of Senay does have disadvantages. As capacitance size is decreased, at a given input frequency, toward a minimum capacitor size capable of generating the necessary high voltage, 70-90 Kv, typically, less charge is available in the gun and as a result, the attraction between the paint or solid material sprayed by the spray gun toward the object to be painted tends to decline. The quality of the surface obtained thus decreases. In particular, there is an objectionable decline in the "wrap-around" effect. This effect, one of the most desirable aspects of electro-static spray coating, results in paint or solid material being deposited on the rear side of the object being painted.

There is thus an unfilled need for a diode-capacitor multiplier circuitry, which combines low energy storage with an acceptable surface being applied on the article being painted.

SUMMARY OF THE INVENTION

The invention comprises a diode-capacitor multiplier circuit with improved performance characteristics. The improvement over the prior art is obtained by using two sizes of capacitor, within the multiplier circuit, instead of one as has been taught by the prior art.

Through the use of two sizes of capacitor it is possible to tune the performance of the spray gun to more closely correspond to the type of paint or solid material being applied. If a latex or water base paint is being applied, the 75-80% of the capacitors at the low voltage end of the multiplier, are selected to have a capacitance twice as large as the minimum necessary to generate the required output, electrode, voltage. The remaining capacitors, preferably located physically at the high voltage end of the multiplier are selected to have capacitance values approaching the minimum needed to generate the required electrode voltage.

Because a non-flammable mixture is being applied, there is no substantial increase in probability of ignition due to the increased energy stored in the multiplier. However, there is a substantial increase in the quality of the paint job on the subject article and in particular, the "wrap-around" effect is substantially enhanced over a minimal energy storage multiplier configuration.

If a highly flammable or a heated paint or material is being applied, only the first or second multiplier stage, at the low voltage end of the multiplier, have larger size capacitors and the remainder of the capacitors have a smaller capacitance. In this instance, the multiplier circuit does not store minimal energy, and gives improved "wrap-around" results over a minimal energy configuration but creates only a slightly increased probability of ignition of the flammable solvents or heated material.

If enamel paints or comparable solid materials are being applied, the one-half of the capacitors in the low voltage end of the diode-capacitor multiplier are selected to have a larger value of capacitance than the value of capacitance of the capacitors of the high voltage ends of the multiplier.

By selecting one-half of the capacitors to have a larger value and one-half to have a smaller value of capacitance, optimal application of material applied to the article is achieved without a substantial increase in the probability of ignition of the paint vapors.

In addition to the ratio of the members of the two different sizes of capacitors, the ratio of the value of the two different capacitance sizes is also important. A ratio of capacitance values of 1 to 2 or 2 to 1 has been found to give good results.

BRIEF DESCRIPTION OF THE DRAWINGS

FIG. 1 is an elevation, partially broken away to show the internal structure, of a hand-held spray pistol coating a selected article and incorporating the inventive diode-capacitor multiplier.

FIG. 2 is a block diagram of the electronics in the hand-held spray gun of FIG. 1.

FIG. 3 is a schematic of a diode-capacitor multiplier adapted to be used with highly flammable paints or solids.

FIG. 4 is a schematic of a diode-capacitor multiplier adapted to be used with less flammable paints or solids.

FIG. 5 is a schematic diagram of a diode-capacitor multiplier adapted to be used with water base paints.

DETAILED DESCRIPTION OF THE PREFERRED EMBODIMENTS

Not for the purpose of limitation, but for the purpose of disclosing the best mode of practicing my invention, and to enable one skilled in the art to practice my invention, there is shown in FIGS. 1 and 2 one way my invention might be used. FIGS. 3-5 disclose three exemplary embodiments of my invention.

FIG. 1 is a side view of an improved electrostatic spray gun 10, partly broken away to show the internal construction of the gun which might incorporate my invention. The improved electrostatic spray gun 10 has a barrel 20 with a spray output opening 23. A bore or passageway 25, interior to the barrel 20, terminates at an atomizer 27 adjacent the opening 23. The passageway 25 provides a path in which the color material to be applied travels within the barrel 20 to the atomizer 27. The barrel 20 is connected to a housing 30 at an end 32.

The housing 30 has a handle 34, an upper portion 35 and a connector 38 to which the end 32 of the barrel 20 is removably affixed. A trigger 40 is rotatably mounted to the upper region 35 of the housing 30. A tubular trigger guard 50 is affixed at a first end 60 to the end 32 of the barrel 20. The trigger guard 50 is hollow having a boring 80 therethrough with a removable cap 90 affixed by a set of threads 95 to a second end 100. A bracket 103 mechanically connects the end 100 of the trigger guard 50 to an end 105 of the handle 34.

A line 110 for supplying color material to the pistol 10 is affixed at a connection 120 to the lower end 105 of the handle 34. If desired, a compressed air line may be affixed at a connection 140 at an end 150 of the upper region 35 of the housing 30.

The connection within the pistol 10 between the color supply input 120 and the compressed air supply brought in through the connection 140 to the housing 30 is of a conventional variety and forms no part of the present invention. As is also conventional, the trigger 40 is operable to control a valve 160 for the purpose of turning the color supply on or off.

The trigger guard 50 has a triangular shaped housing 170 affixed to a surface 180. The surface 180 is adjacent the trigger 40. A metal end 190 of the trigger 40 is located adjacent a side 200 of the triangular housing 170. Within the triangular housing 170 is located a proximity switch 210 of a conventional type which is operable to detect the presence or absence of the metal end 190 of the trigger 40. A manual rotation of the end 190 of the trigger 40 away from or toward the triangular housing 170 will open or close the proximity switch 210.

Embedded in the barrel 20 of the pistol 10 and extending longitudinally along the bottom thereof is a first conductor 220 and a second conductor 230. The first conductor 220 has an end 240 which terminates adjacent to the first end 60 of the trigger guard 50. A short conducting extension 250 rigidly affixed within the first end 60 of the trigger guard 50 makes contact with the end 240 of the conductor 220. The conductor 220 has a second end 260 which makes contact with a current limiting resistor 270 also embedded within the barrel 20 of the housing 10. The conductor 230 has a first end 280 which completes the connection to the resistor 270 and has a second end 290 which forms a paint spray electrode adjacent the atomizer 27 near the end of the paint material transporting passage 25 and also near the paint output end 23 of the barrel 27. A typical value of the resistor 270 might be on the order of 50 million ohms.

Removably mounted within the trigger guard 50 is a step-up transformer module 310 mounted adjacent a high voltage diode-capacitor multiplier circuit module 320. The step-up transformer has a low voltage input 330, and a high voltage output 340. The high voltage output 340 of the step-up transformer 310 is connected to an input end 350 of the diode-capacitor multiplier circuitry 320. A high voltage direct current output end 360 of the multiplier 320 is in contact with the embedded conductor 250 located at the first end 60 of the trigger guard 50.

The low voltage input end 330 of the step-up transformer 310 is connected via the proximity switch 210 to a low voltage input cable 370 which is affixed to the removable cap 90 at the second end 100 of the trigger guard 50.

Both the step-up transformer 310 and the high voltage multiplier circuit 320 may be removed from the boring 80 of the trigger guard 50 once the cap 90 has been removed from the second end 100.

A typical input voltage which might be supplied on the low voltage cable 370 is 12 volts at an input frequency of 17,000 Hz. This signal is stepped up to some convenient intermediate AC voltage on the order of 7000 volts, peak to peak, still at 17,000 Hz by the step-up transformer 310 and then is converted by the multiplier circuitry 320 to an output voltage at the high voltage output 360 on the order of 80 to 90 Kv. The 80 to 90 Kv is then delivered through the conductor 220, the resistor 270 and the conductor 230 to the paint spraying electrode 290.

The gun 10 is shown in FIG. 1 directing a spray of material S toward a grounded article A. The article A on the surface A1, is directly coated by the material spray S. The rear surface A2 of article A is coated by the "wrap-around" effect wherein spray S is deposited on the surface A2 of article A along lines f1, f2.

FIG. 2 is a block diagram schematic of the electronic circuitry housed within the gun 10 of FIG. 1. The 12 volt 17 Khz signal is brought in via the cable 370 to the proximity switch 210. The output of the proximity switch 210 switches the input 330 to the step-up transformer 310. The output 340 of the step-up transformer 310 is connected to the input 350 of the high voltage multiplier circuit 320. The high voltage output line 360 from the high voltage multiplier circuitry 320 is then connected through the conductors 250, 220, the resistor 270, and the conductor 230 to the paint spraying electrode 290.

FIG. 3 discloses one embodiment of my diode-capacitor multiplier circuit 320 which is especially adapted to be used with highly flammable paints or materials or with heated paints or materials. The diode-capacitor multiplier circuit 320 of FIG. 3 is comprised of twelve stages labeled 400 through 414. Multiplier stages 402 through 414 are identical. Stages 404 through 412 are each indicated schematically by a rectangle and each of the rectangles 404 through 412 contains a circuit which is identical to the circuit shown in rectangle 402. Voltage output by the transformer 310 is applied at the terminals 350 corresponding to the low-voltage end of the multiplier 320. The direct voltage which is generated by the multiplier 320 appears at the output terminal 360. The low-voltage input multiplier stage 400 of the diode-capacitor multiplier embodiment 320 of FIG. 3 is comprised of a pair of 250 pf capacitors 418, 420. The multiplier stage 400 is also comprised of a pair of diodes 422, 424. The circuitry of the diode-capacitor multiplier stage 400 is conventional and is well known from the prior art.

The second multiplier stage 402 of the diode-capacitor multiplier 320 of FIG. 3 has a pair of 125 pf capacitors 428, 430. Additionally, the multiplier stage 402 includes a pair of diodes 432, 434. The capacitors 428, 430 of the multiplier 402 have a capacitance exactly one-half the capacitance of the capacitors 418, 420 of the multiplier stage 400. Each of the multiplier stages 404 through 414 includes a pair of capacitors corresponding in capacitance to the capacitors 428, 430 of the multiplier stage 402. Thus, the diode-capacitor multiplier circuit 420 of FIG. 3 has a first stage 400 having two capacitors 418, 420 each of which has a capacitance value which is twice the capacitance value of the capacitors in all of the remaining multiplier stages 402 through 414.

The diode-capacitor multiplier circuit 320 of FIG. 3 will generate an output voltage on the order of 90K volts DC at the terminal 360 when an alternating input voltage on the order of 7 Kv peak-to-peak at a frequency of 17 Khz is applied across the input terminals 350. I have found that a 12 stage multiplier such as the multiplier 320 using only 125 pf capacitors would generate the required 90K volts DC and would store less energy than does the multiplier 320 but it does not apply as good a coating as does the multiplier 320 of FIG. 3. However, by selecting only two of the capacitors at the low voltage end, 418, 420 of the multiplier stage 400 to have a 250 pf value of capacitance, and by selecting all of the remaining capacitors corresponding to the capacitors 428, 430 of the multiplier stage 402 in the diode-capacitor multiplier circuitry 320 to have a value of only 125 pf the multiplier circuit 320 will store more energy than would a twelve stage multiplier circuit which is comprised of only 125 pf capacitors. Additionally, since the low-voltage multiplier stage 400 includes the two larger capacitors 418, 420 the "wrap-around" effect as indicated by the lines f1, f2 of FIG. 1, will be enhanced over the effect achievable with an electrostatic gun such as the gun 10 which incorporates a diode-capacitor multiplier circuit having minimal capacitive energy storage. Thus, with the diode-capacitor multiplier circuit 320 of FIG. 3, the "wrap-around" effect due to the paint spray S following lines f1 and f2 of FIG. 1 to the surface A2 of article A will be enhanced over that achievable by utilizing a diode-capacitor multiplier circuit having a comparable structure to the twelve-stage multiplier structures of 320 of FIG. 3 but wherein all capacitors are 125 pf capacitors.

FIG. 4 discloses a diode-capacitor multiplier circuit 320a especially suited for use with enamel paints or solid materials which are less flammable. The diode-capacitor multiplier circuit 320a is comprised of six multiplier stages 440 through 450 each of which contains a pair of 250 pf capacitors corresponding to the capacitors 452, 454 of the multiplier stage 440. Additionally, each of the modules 442 through 450 includes a pair of diodes corresponding to the pair of diodes 454, 456 of the multiplier stage 440. Each of the stages 442 through 450 is identical to the stage 440 and is represented by a rectangle. The top or high voltage half of the diode-capacitor multiplier circuit 320a is comprised of six identical multiplier stages 460 through 470. Each of the stages 462 through 468 which is represented by an eight-sided figure in FIG. 4 contains a circuit which is identical to the circuit of the multiplier stage 460. A description of the multiplier stage 460 will also describe the multiplier stages 462 through 470. The multiplier stage 460 comprises a pair of capacitors 472, 474 each of which has a value of 125 pf. Additionally, the multiplier stage 460 includes a pair of diodes 476, 478.

The diode-capacitor multiplier circuit 329a of FIG. 4 when driven by a 7 kv peak-to-peak 17 khz input signal at the terminals 350a will generate at the output terminal 360a a DC voltage of approximately 90 Kv. However, because the lower half of the diode-capacitor multiplier circuit 320a, multiplier stages 440 through 450 each contains 250 pf capacitors such as the capacitors 452, 454 which have twice the capacity of the 125 pf capacitors such as the capacitors 472, 474 of the multiplier stages 460 through 470, the quality of the paint job applied to the article A by a spray gun 10 containing the diode-capacitor multiplier circuit 320a, including the "wrap-around" effect, will be enhanced over the quality of the paint job applied by the same spray gun 10 to a comparable article A where that spray gun 10 has a twelve stage diode-capacitor multiplier circuit comparable to the multiplier circuit 320a but wherein only 125 pf capacitors are used. The diode-capacitor multiplier circuit 320a stores more energy than does a comparable twelve-stage diode capacitor multiplier circuit which would incorporate only 125 pf capacitors. However, because less flammable coating materials are being applied by the gun 10 using the multiplier 320a, the probability of ignition is not substantially increased over the case where a multiplier storing only minimal amounts of energy is used.

FIG. 5 discloses a twelve-stage diode-capacitor multiplier circuit 320b adapted to be used with latex or other water-based paints. The diode-capacitor multiplier circuit 320b is comprised of 11 identical multiplier stages 500 through 520 and a twelfth multiplier stage 522 located adjacent a high-voltage output point 360b of the diode-capacitor multiplier circuit 320b. Each of the multiplier stages 500 through 520 is identical to the multiplier circuit 500 which is located adjacent the low-voltage input terminal 350b of the multiplier 320b. A description of the multiplier stage 500 will also describe the multiplier stages 502 through 520, each of which is indicated schematically in FIG. 5 by a rectangle. The multiplier stage 500 has a pair of 250 pf capacitors 524, 526. Additionally, the multiplier stage 500 has a pair of diodes 528, 530.

At the high-voltage end of the diode-capacitor multiplier 320b the highest voltage multiplier stage 522 includes a pair of 125 pf capacitors 544, 546. Additionally, the multiplier stage 522 includes a pair of diodes 548, 550.

The diode-capacitor multiplier circuitry 320b of FIG. 5 stores substantially higher amounts of energy than does the diode-capacitor multiplier circuit 320 of FIG. 3. However, where the diode-capacitor multiplier circuit 320b of FIG. 5 is used in conjunction with a latex or water-base paint or a non-flammable powder, the finish applied to the article A by the material S, and in particular the "wrap-around" effect, shown in flow-lines f1 and f2 of FIG. 1, is substantially improved over the finish and "wrap-around" effect achievable with respect to the article A where the diode-capacitor multiplier circuit 320 of FIG. 3 is utilized. In view of the water-based or non-inflammable nature of the material being applied, by the gun 10, the substantially additional energy stored by the multiplier 320b does not present a substantially increased safety hazard as would be the case if the multiplier 320b were to be utilized with a highly flammable paint or material.

The ratio of the two capacitance values described previously is 1 to 2 or 2 to 1. Other ratios of capacitance values might also be used. While the multipliers 320, 320a, 320b have been disclosed and discussed with respect to the hand-held electrostatic spray gun 10, it will be understood that my invention is not limited to use with hand-held spray guns but in fact could be utilized just as effectively with fixed type installations.

Additionally it is recognized that in some installations it might be desirable to have more than two different capacitance values within a diode-capacitor high voltage multiplier. That alternate would also be within the scope of my invention.

Although various modifications might be suggested by those skilled in the art, it should be understood that I wish to embody within the scope of the patent warranted hereon all such modifications as reasonably and properly come within the scope of my contribution to the art.

I claim as my invention:

1. In a diode-capacitor multiplier circuit usable to generate a selected output voltage within a selected range for use in an electrostatic spray apparatus to apply a coating to an article, the multiplier having a selected number of stages and with each stage including a plurality of interconnected diodes and capacitors, an improvement comprising:
a first selected number of two or more capacitors each having a first selected value of capacitance;
a second selected number of two or more capacitors each having a second, different, value of capacitance; and
wherein a ratio of said first selected value of capacitance to said second selected value of capacitance corresponds substantially to a ratio of 1 to 2;
said first selected number of capacitors corresponds to a number within a range of 5% to 10% of the total number of capacitors in the multiplier and,
said second selected number of capacitors corresponds to the remainder of capacitors in the multiplier.

2. In a diode-capacitor voltage multiplier circuit having a plurality of interconnected multiplier stages wherein each stage is formed of interconnected diodes and capacitors, in improvement comprising:
a first selected plurality of multiplier stages wherein each capacitor in each said multiplier in said first plurality has a first selected value of capacitance; and
a second selected plurality of multiplier stages wherein each capacitor in each said multiplier in said second plurality has a second selected value of capacitance, different from said first selected capacitance;
a ratio of said first selected value of capacitance to said second selected value of capacitance corresponds substantially to a ratio of 1 to 2.

3. In a diode-capacitor multiplier circuit usable to generate a selected output voltage within a selected range for use in an electrostatic spray apparatus to apply a coating to an article, the multiplier having a selected number of stages and with each stage including a plurality of interconnected diodes and capacitors, and improvement comprising:
a first selected number of two or more capacitors each having a first selected value of capacitance;
a second selected number of two or more capacitors each having a second, different, value of capacitance; and
wherein a ratio of said first selected value of capacitance to said second selected value of capacitance corresponds substantially to a ratio of 1 to 2;
said first selected number of capacitors corresponds to a number within a range of 45% to 55% of the total number of capacitors in the multiplier, and
said second selected number of capacitors corresponds to the remainder of capacitors in the multiplier.

* * * * *